United States Patent
Nebashi et al.

(10) Patent No.: US 10,812,076 B2
(45) Date of Patent: Oct. 20, 2020

(54) LOGIC INTEGRATED CIRCUIT AND SEMICONDUCTOR DEVICE

(71) Applicant: NEC Corporation, Minato-ku, Tokyo (JP)

(72) Inventors: Ryusuke Nebashi, Tokyo (JP); Toshitsugu Sakamoto, Tokyo (JP); Makoto Miyamura, Tokyo (JP); Yukihide Tsuji, Tokyo (JP); Ayuka Tada, Tokyo (JP); Xu Bai, Tokyo (JP)

(73) Assignee: NEC CORPORATION, Tokyo (JP)

( * ) Notice: Subject to any disclaimer, the term of this patent is extended or adjusted under 35 U.S.C. 154(b) by 231 days.

(21) Appl. No.: 16/061,701

(22) PCT Filed: Jan. 16, 2017

(86) PCT No.: PCT/JP2017/001147
§ 371 (c)(1),
(2) Date: Jun. 13, 2018

(87) PCT Pub. No.: WO2017/126451
PCT Pub. Date: Jul. 27, 2017

(65) Prior Publication Data
US 2019/0028101 A1    Jan. 24, 2019

(30) Foreign Application Priority Data
Jan. 18, 2016  (JP) ................................ 2016-006790

(51) Int. Cl.
*G11C 11/00* (2006.01)
*H03K 19/003* (2006.01)
(Continued)

(52) U.S. Cl.
CPC ......... *H03K 19/003* (2013.01); *G06F 11/073* (2013.01); *G06F 11/0751* (2013.01);
(Continued)

(58) Field of Classification Search
CPC ............ G11C 13/0011; G11C 13/0023; G11C 13/003; G11C 13/004; G11C 13/0059; G11C 2213/15
See application file for complete search history.

(56) References Cited

U.S. PATENT DOCUMENTS

| 8,102,696 B2 * | 1/2012 | Katoh | G11C 13/0069 365/148 |
| 8,159,894 B2 * | 4/2012 | Schmitt | G11C 17/18 365/225.7 |

(Continued)

FOREIGN PATENT DOCUMENTS

| JP | 2015-82671 A | 4/2015 |
| WO | 99/48103 A1 | 9/1999 |

(Continued)

OTHER PUBLICATIONS

Microsemi Corporation, "RTAX-S/SL and RTAX-DSP Radiation-Tolerant FPGAs", Feb. 2015, Revision 17 (total 276 pages).
(Continued)

*Primary Examiner* — Pho M Luu

(57) ABSTRACT

A logic integrated circuit includes: a three-terminal resistance change switch including a first resistance change switch and a second resistance change switch connected in series; a reading circuit which reads first data based on a resistance state of the first resistance change switch and second data based on a resistance state of the second resistance change switch; and a first error detection circuit which compares the first data with the second data and issue an output based on a result of the comparison.

14 Claims, 10 Drawing Sheets

(51) Int. Cl.
   *G11C 13/00* (2006.01)
   *H03K 19/17748* (2020.01)
   *H03K 19/177* (2020.01)
   *G06F 11/07* (2006.01)
   *H01L 27/24* (2006.01)
   *H01L 45/00* (2006.01)

(52) U.S. Cl.
   CPC .......... *G11C 13/003* (2013.01); *G11C 13/004* (2013.01); *G11C 13/0011* (2013.01); *G11C 13/0023* (2013.01); *G11C 13/0059* (2013.01); *H01L 27/2436* (2013.01); *H01L 27/2463* (2013.01); *H01L 45/085* (2013.01); *H01L 45/1233* (2013.01); *H03K 19/177* (2013.01); *H03K 19/17748* (2013.01); *G11C 2213/15* (2013.01); *G11C 2213/78* (2013.01); *G11C 2213/79* (2013.01); *H01L 45/1266* (2013.01)

(56) References Cited

U.S. PATENT DOCUMENTS

| 9,536,581 | B2 * | 1/2017 | Katoh ................ G11C 13/0059 |
| 2001/0037482 | A1 | 11/2001 | Plants |
| 2014/0043059 | A1 | 2/2014 | Speers et al. |

FOREIGN PATENT DOCUMENTS

| WO | 2012/043502 A1 | 4/2012 |
| WO | 2013/187193 A1 | 12/2013 |

OTHER PUBLICATIONS

M. Miyamura et.al., "Programmable cell array using rewritable solid-electrolyte switch integrated in 90nm CMOS", Solid-State Circuits Conference Digest of Technical Papers (ISSCC), 2011 IEEE International, Feb. 2011, pp. 228-229.

M. Tada, et. at., "Highly Reliable, Complementary Atom Switch (CAS) with Low Programming Voltage Embedded in Cu BEOL for Nonvolatile Programmable Logic", IEEE International Electron Devices Meeting 2011 IEDM Technical Digest, Dec. 2011, pp. 30.2.1-30.2.4 (total 4 pages).

Xilinx Inc., "Virtex-4 FPGA Configuration User Guide" UG071 (v1.11) Jun. 9, 2009 (total 114 pages).

International Search Report dated Apr. 4, 2017, issued by the International Searching Authority in application No. PCT/JP2017/001147.

* cited by examiner

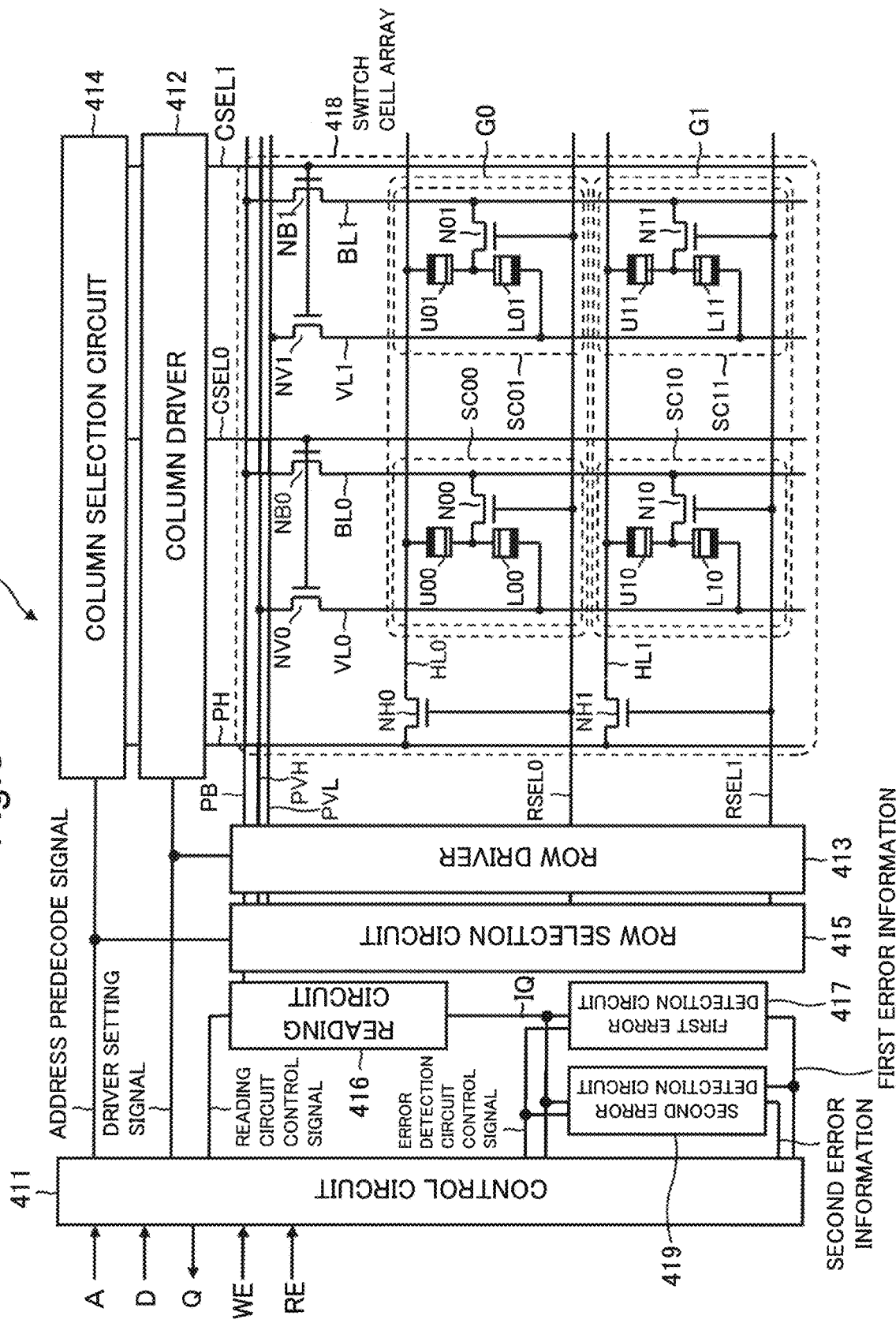

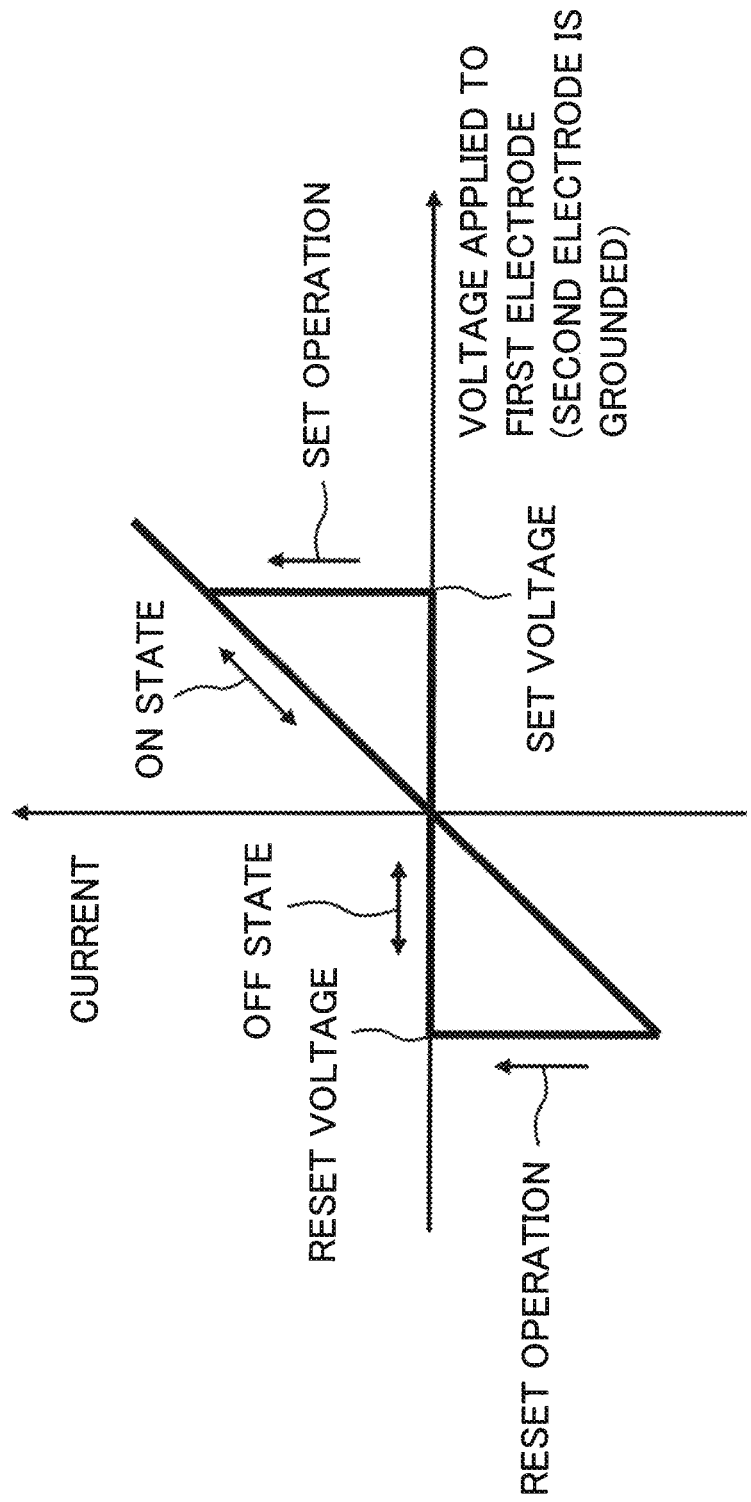

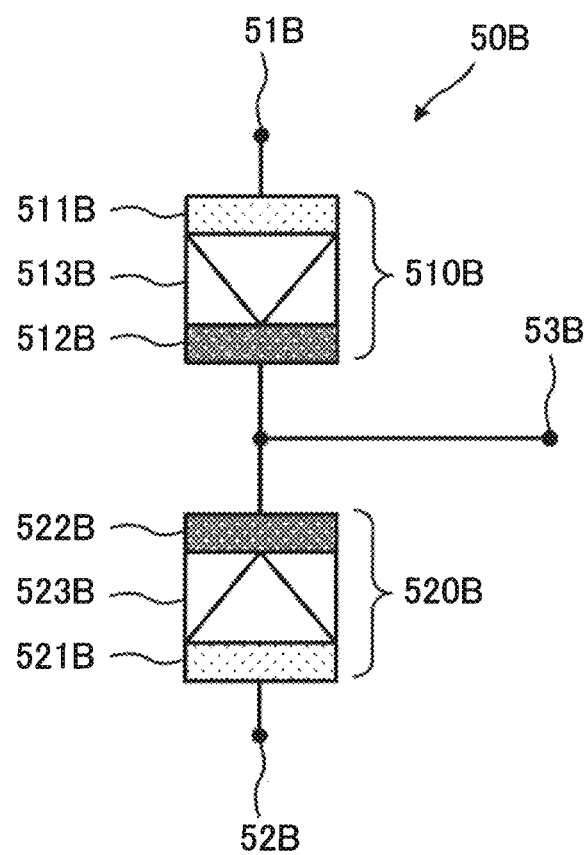

LOGIC INTEGRATED CIRCUIT AND SEMICONDUCTOR DEVICE

This application is a National Stage Entry of PCT/JP2017/001147 filed on Jan. 16, 2017, which claims priority from Japanese Patent Application 2016-006790 filed on Jan. 18, 2016, the contents of all of which are incorporated herein by reference, in their entirety.

TECHNICAL FIELD

The present invention relates to a technique for a reconfigurable programmable logic integrated circuit using a resistance change switch.

BACKGROUND ART

A programmable logic integrated circuit is an integrated circuit capable of reconfiguring a part of a circuit according to logic circuit configuration information. This circuit enables reduction in costs required for developing products of many kinds in small quantities, as compared with an Application Specific Integrated Circuit (ASIC) having a dedicated design. In addition, a degree of freedom of design capable of correcting a circuit after completion of a device can be provided.

In a programmable logic integrated circuit using a Static Random Access Memory (SRAM), an SRAM cell stores logic circuit configuration information. The SRAM cell is arranged over the logic integrated circuit and used in combination with a transistor. When an error occurs in the configuration information stored in the SRAM cell, the logic integrated circuit may not execute a desired logical operation. In addition, an unintended transistor may be turned on and a large current may flow to a circuit due to a collision of signals through the transistor, so that the circuit may be destroyed. Accordingly, in terms of reliability of a circuit, it is necessary to hold the configuration information stored in the SRAM cell without causing an error.

However, a soft error called Single Event Upset (SEU) occurs in an SRAM cell. One of causes for SEU is a neutron ray derived from a cosmic ray. When secondary particles due to the neutron ray provide an SRAM cell with energy sufficient to invert data in the SRAM cell, data inversion occurs, which may cause an error.

As a method for improving reliability, NPL 1 discloses a programmable logic integrated circuit using an anti-fuse. The anti-fuse holds data by using a resistance, and thus has high SEU resistance, unlike the SRAM. Further, there is no need to transfer data from an external nonvolatile memory upon power-on, and thus there is no possibility that configuration information is stolen by measurement of an electric signal during data transfer. In other words, the anti-fuse has an advantage that tamper resistance is high. However, the anti-fuse has a disadvantage that the anti-fuse is a one-time memory in which data cannot be overwritten once data are programmed.

As a method for improving reliability, NPL 2 discloses a programmable logic integrated circuit using a resistance change switch. The resistance change switch holds data by using a resistance, and thus has high SEU resistance, like the anti-fuse. The resistance change switch has an advantage that the resistance change switch is capable of overwriting data and a size of the resistance change switch is small. The resistance change switch further has another advantage that tamper resistance is high, like the anti-fuse.

FIG. 7A illustrates a structure of a resistance change switch, and FIG. 7B illustrates current-voltage characteristics of the resistance change switch. A resistance change switch 500 includes a first electrode 501, a resistance change layer 503, and a second electrode 502. The resistance change switch 500 transits between a low resistance state (referred to as an ON state) and a high resistance state (referred to as an OFF state) by application of a voltage.

As illustrated in FIG. 7B, when the second electrode 502 is grounded and a positive voltage is applied to the first electrode 501, the resistance change switch transits from the OFF state to the ON state at a certain threshold voltage. An operation of causing the resistance change switch to transit from the OFF state to the ON state is referred to as a set operation, and a voltage at which the set operation occurs is referred to as a set voltage. When a voltage is applied to to the first electrode 501 in the ON state, linear current-voltage characteristics corresponding to the voltage are obtained. On the other hand, when a negative voltage is applied to the first electrode 501, the resistance change switch transits from the ON state to the OFF state at a certain threshold voltage. An operation of causing the resistance change switch from the ON state to the OFF state is referred to as a reset operation, and a voltage at which the reset operation occurs is referred to as a reset voltage. When a voltage is applied to the first electrode 501 in the OFF state, no current flows. The resistance change switch that transits between the ON state and the OFF state depending on a polarity of a voltage to be applied is referred to as a bipolar-type resistance change switch.

NPL 2 discloses, as an example of the bipolar-type resistance change switch, a resistance change switch using an ion conductor as a solid in which ions are moved by an electric field, and using metal ion migration and electrochemical reaction in the ion conductor. The switch disclosed in NPL 2 includes an ion conductive layer and two electrodes opposed to each other with the ion conductive layer formed therebetween. One of the two electrodes is referred to as an active electrode that supplies metal ions to the ion conductive layer. Another electrode thereof is referred to as an inactive electrode that does not supply metal ions to the ion conductive layer. To deal with the current-voltage characteristics of the switch illustrated in FIG. 7B, the first electrode 501 corresponds to the active electrode and the second electrode 502 corresponds to the inactive electrode.

In the resistance change switch using the ion conductor, when the second electrode 502, as the inactive electrode, is grounded, and a positive voltage is applied to the first electrode 501 as the active electrode, metal in the active electrode is dissolved in the resistance change layer 503, which is the ion conductive layer, as metal ions. The metal ions in the ion conductive layer are deposited as metal in the ion conductive layer, and the deposited metal forms a metal bridge that connects the inactive electrode and the active electrode to each other. The both electrodes are electrically connected by the metal bridge, thereby bringing the switch into the ON state. On the other hand, when the inactive electrode is grounded in the ON state and a negative voltage is applied to the active electrode, the metal bridge is dissolved in the resistance change layer 503 and a part of the metal bridge is broken. Thus, the electrical connection between the both electrodes is disconnected, thereby bringing the switch into the OFF state. In order to change from the OFF state to the ON state again, the inactive electrode may be grounded again and a positive voltage may be applied to the active electrode.

When the resistance change switch is used for setting connection or non-connection of a signal line of the programmable logic integrated circuit, ten years or longer are required as the number of years for holding the ON state and the OFF state, like in a nonvolatile memory such as a flash memory. Disturbance as an influence of the signal line on the switch is caused because a current flowing through the signal line is added to the switch in the ON state, or because a voltage applied to the signal line is added to the switch in the OFF state. A malfunction in which a state of the switch transits due to the disturbance is referred to as a disturbance failure.

NPL 3 discloses a method for suppressing a disturbance failure in the OFF state. FIGS. 8A and 8B illustrate structures of three-terminal resistance change switches 50A and 50B, respectively, in which a combination of two bipolar-type resistance change switches connected in series as disclosed in NPL 3 is used as one switch. The three-terminal resistance change switch 50A includes resistance change switches 510A and 520A. First electrodes 511A and 521A which are active electrodes in resistance change layers 513A and 523A of the respective resistance change switches 510A and 520A are connected to each other, and a connecting portion therebetween is set as a common node 53A. A second electrode 512A and a second electrode 522A, as inactive electrodes, are set as a first node 51A and a second node 52A, respectively.

The three-terminal resistance change switch 50B includes resistance change switches 510B and 520B. Second electrodes 512B and 522B which are inactive electrodes in resistance change layers 513B and 523B of the respective resistance change switches 510B and 520B are connected to each other, and a connecting portion therebetween is set as a common node 53B. A first electrode 511B and a first electrode 521B which are active electrodes in the resistance change layers 513B and 523B are set as a first node 51B and a second node 52B, respectively.

In the three-terminal resistance change switches 50A and 50B disclosed in NPL 3, the ON state is a state in which both the two resistance change switches are brought into the ON state, and the OFF state is a state in which one of the two resistance change switches is brought into the OFF state.

The common nodes 53A and 53B are set in a floating state at a time other than the switch switching operation. Accordingly, the disturbance in the OFF state is caused by a voltage applied between the first nodes 51A and 51B and the second nodes 52A and 52B. Assuming that the voltage is represented by VD, VD is divided into voltages by two resistance change switches connected in series. Accordingly, in the three-terminal resistance change switches 50A and 50B, a voltage to be applied to each resistance change switch is smaller than that in a two-terminal resistance change switch composed of one resistance change switch. Further, a polarity of VD in one of the two resistance change switches matches a polarity for resetting the switch, and thus the OFF state is maintained. As described above, the three-terminal resistance change switches 50A and 50B can suppress a disturbance failure, and thus it can be said that the three-terminal resistance change switches 50A and 50B are switches with high error resistance and high data reliability.

Further, as a method for improving reliability, a method using a circuit technique instead of a switch structure is disclosed. PTL 1 discloses a programmable logic integrated circuit using a Cyclical Redundancy Checking (CRC). According to PTL 1, configuration information about an SRAM cell is read, and a CRC value is calculated to detect an error. In this case, a cell in which an error occurs is not identified.

PTL 2 discloses a programmable logic integrated circuit using a Message Authentication Code (MAC). According to PTL 2, configuration information about an SRAM cell is read, and a MAC value is calculated to detect an error. In this case, a cell in which an error occurs is not identified.

NPL 4 discloses a programmable logic integrated circuit using an Error Correction Code (ECC). According to NPL 4, a Hamming code to which a parity bit is added as the ECC is used, thereby enabling error correction up to one-bit error and error detection up to two-bit error.

CITATION LIST

Patent Literature

[PTL 1] Specification of U.S. unexamined patent application publication No. 2001/0037482
[PTL 2] Specification of U.S. unexamined patent application publication No. 2014/0043059

Non Patent Literature

[NPL 1] Micro semi Corporation, "RTAX-S/SL and RTAX-DSP Radiation-Tolerant FPGAs" Revision 17.
[NPL 2] M. Miyamura, et. al., "Programmable cell array using rewritable solid-electrolyte switch integrated in 90 nmCMOS", Solid-State Circuits Conference Digest of Technical Papers (ISSCC), 2011 IEEE International, pp. 228-229, February 2011.
[NPL 3] M. Tada, et. at., "Highly reliable, complementary atom switch (CAS) with low programming voltage embedded in Cu BEOL for Nonvolatile Programmable Logic", IEEE International Electron Devices Meeting 2011 IEDM Technical Digest, pp. 30.2.1-30.2.4, December 2011.
[NPL 4] Xilinx Inc., "Virtex-4 FPGA Configuration User Guide" UG071 (v1.11) Jun. 9, 2009.

SUMMARY OF INVENTION

Technical Problem

In the case of techniques disclosed in PTL 1 and PTL 2, an SRAM cell in which an error occurs cannot be identified. Accordingly, when an error is detected, for example, configuration information stored in an external involatile memory is transferred and an error location is identified, and then the error is corrected. During transfer of the configuration information, an attacker can steal the configuration information by measuring an electric signal being transferred. In other words, there is a problem that tamper resistance is lowered.

In the method using an ECC disclosed in NPL 4, there is a need to provide a redundant parity bit for error detection and correction, which causes a problem that a chip area increases.

Even when the technique disclosed in NPL 3 is used, it is impossible to completely eliminate a disturbance failure, and thus there is a problem that the programmable logic integrated circuit may not execute a desired logical operation.

The present invention has been made in view of the above-mentioned problems, and an object of the present invention is to provide a logic integrated circuit that increases reliability of configuration information held in a switch while maintaining high tamper resistance and a small chip area.

Solution to Problem

A logic integrated circuit according to the present invention includes: a three-terminal resistance change switch including a first resistance change switch and a second resistance change switch being connected in series; a reading circuit which reads first data based on a resistance state of the first resistance change switch and second data based on a resistance state of the second resistance change switch; and a first error detection circuit which compares the first data with the second data and issue an output based on a result of the comparison.

A semiconductor device according to the present invention includes: a three-terminal resistance change switch including a first resistance change switch and a second resistance change switch being connected in series; a reading circuit which reads first data based on a resistance state of the first resistance change switch and second data based on a resistance state of the second resistance change switch; and a first error detection circuit which compares the first data with the second data and issue an output based on a result of the comparison.

Advantageous Effects of Invention

According to the present invention, it is possible to provide a logic integrated circuit that increases reliability of configuration information held in a switch while maintaining high tamper resistance and a small chip area.

BRIEF DESCRIPTION OF DRAWINGS

FIG. 6 is a schematic diagram illustrating a circuit configuration of a programmable logic core of a programmable logic integrated circuit according to a fourth example embodiment of the present invention;
FIG. 7B is a diagram illustrating an operation of the resistance change switch;
FIG. 8B is a diagram illustrating a configuration of a three-terminal resistance change switch.

EXAMPLE EMBODIMENT

Example embodiments of the present invention will be described in detail below with reference to the drawings. Although technically preferred limitations for carrying out the present invention are given in the following example embodiments, the scope of the invention is not limited to the following example embodiments.

First Example Embodiment

Figure 1:
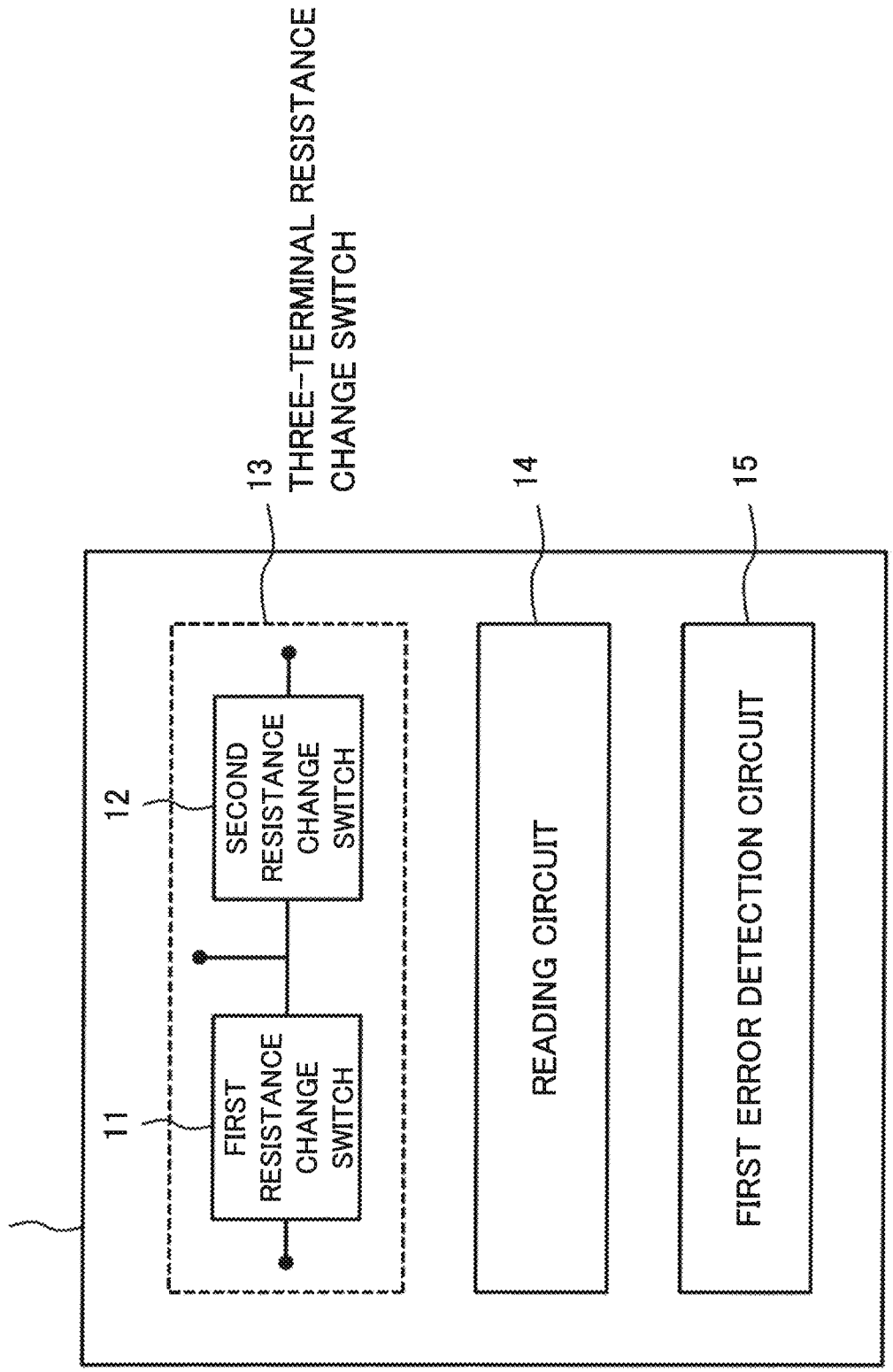
FIG. 1 is a block diagram illustrating a configuration of a programmable logic integrated circuit according to a first example embodiment of the present invention.

FIG. 1 is a block diagram illustrating a configuration of a programmable logic integrated circuit according to a first example embodiment of the present invention. A programmable logic integrated circuit 1 according to this example embodiment includes a three-terminal resistance change switch 13 including a first resistance change switch 11 and a second resistance change switch 12 which are connected in series. The programmable logic integrated circuit 1 further includes a reading circuit 14 that reads first data corresponding to a resistance state of the first resistance change switch 11 and second data corresponding to a resistance state of the second resistance change switch 12. The programmable logic integrated circuit 1 further includes a first error detection circuit 15 that compares the first data with the second data and issues an output based on a result of the comparison.

As described above, the programmable logic integrated circuit 1 uses a three-terminal resistance change switch with high error resistance as a switch constituting a logic circuit based on configuration information and is further capable of detecting an error in the circuit.

Therefore, according to this example embodiment, it is possible to provide a logic integrated circuit that increases reliability of configuration information held in a switch while maintaining high tamper resistance and a small chip area.

Second Example Embodiment

Figure 2:
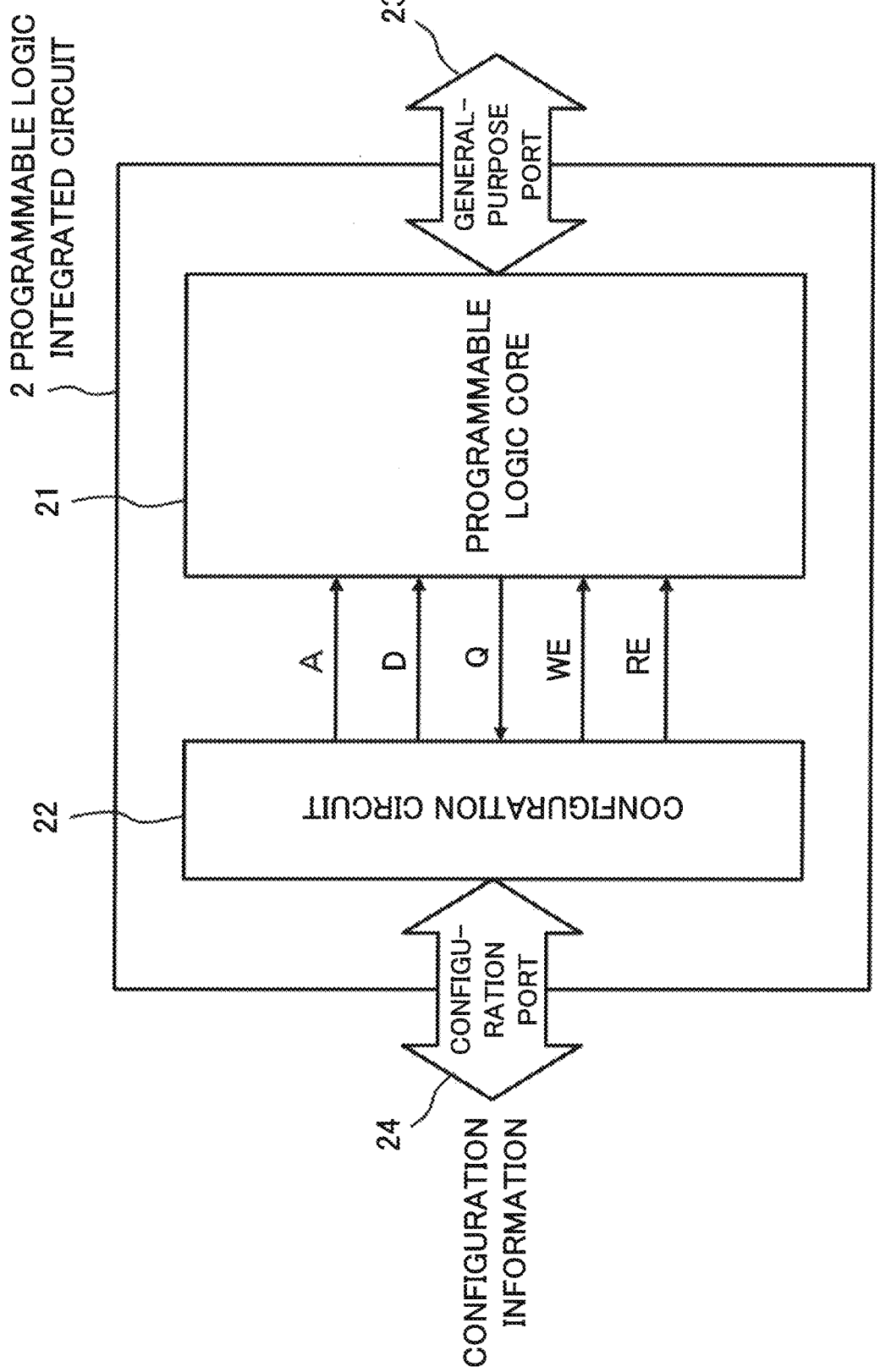
FIG. 2 is a block diagram illustrating a configuration of a programmable logic integrated circuit according to a second example embodiment of the present invention.

FIG. 2 is a block diagram illustrating a configuration of a programmable logic integrated circuit according to a second example embodiment of the present invention. A programmable logic integrated circuit 2 according to this example embodiment includes a programmable logic core 21, a configuration circuit 22, a general-purpose port 23, and a configuration port 24.

The programmable logic core 21 includes a resistance change switch. The resistance change switch connects or disconnects a wiring based on logic circuit configuration information. This enables the logic configuration or reconfiguration of the programmable logic core 21. The programmable logic core 21 inputs input data from the general-purpose port 23 to a logic circuit configured based on the configuration information, and outputs a logical operation result to a general-purpose port.

The configuration circuit 22 receives a signal including the configuration information input from the configuration port 24, outputs a control signal to the programmable logic core 21, and inputs or outputs data. During writing of the resistance change switch, the configuration circuit 22 sets a writing enable signal WE to a high level, thereby writing input data D into the resistance change switch having an address A. During reading of the resistance change switch, the configuration circuit 22 sets a reading enable signal RE to a high level, thereby receiving a data output Q as data read from the resistance change switch having the address A.

Figure 3:
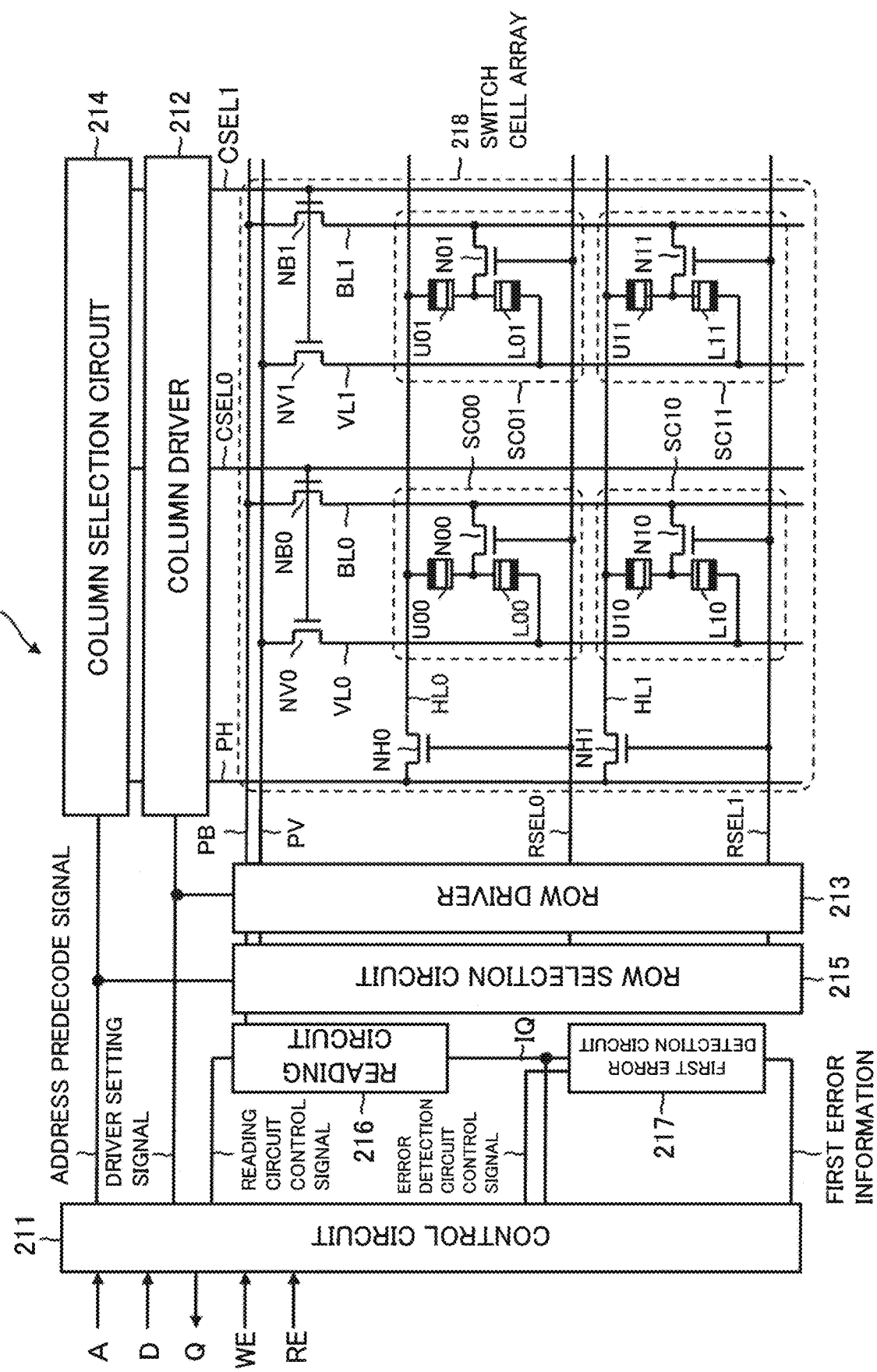
FIG. 3 is a schematic diagram illustrating a circuit configuration of a programmable logic core of the programmable logic integrated circuit according to the second example embodiment of the present invention.

FIG. 3 is a schematic diagram illustrating a circuit configuration of the programmable logic core 21 of the programmable logic integrated circuit 2 according to this example embodiment. The programmable logic core 21 includes a control circuit 211, a column driver 212, a row driver 213, a column selection circuit 214, a row selection circuit 215, a reading circuit 216, a first error detection circuit 217, and a switch cell array 218.

Note that the programmable logic core 21 includes various logic circuits, such as a lookup table and a flip-flop, to perform a desired logical operation in combination with the switch cell array 218. In this example embodiment, these logic circuits are provided as needed, and thus the illustration of these logic circuits is omitted in FIG. 3.

The switch cell array 218 includes a group of N (N is an integer not less than 2) vertical lines extending in a column direction and a group of M (M is an integer not less than 2) horizontal lines extending in a row direction. Further, the switch cell array 218 includes N×M switch cells at maximum that are each provided at a portion where a vertical line and a horizontal line intersect with each other and configured to switch connection and non-connection between the vertical line and the horizontal line. FIG. 3 illustrates an example of the configuration of the switch cell array, which includes two horizontal lines HL0 and HL1 extending in the row direction, two vertical lines VL0 and VL1 extending in the column direction, and switch cells SC00, SC01, SC10, and SC11 arranged in the respective portions where the vertical line and the horizontal line intersect with each other.

The switch cell array 218 further includes column selection lines CSEL0 and CSEL1 extending in the column direction, row selection lines RSEL0 and RSEL1 extending in the row direction, a wiring PH extending in the column direction, and wirings PV and PB extending in the row direction. The switch cell array 218 further includes Negative-channel Metal Oxide Semiconductor (NMOS) transistors NV0, NV1, NB0, and NB1 arranged in the row direction, and NMOS transistors NH0 and NH1 arranged in the column direction.

The switch cells SC00, SC01, SC10, and SC11 include first resistance change switches U00, U01, U10, and U11, second resistance change switches L00, L01, L10, and L11, and NMOS transistors N00, N01, N10, and N11, respectively.

First, The connection relationship between the control circuit 211 and each circuit component will be described. The control circuit 211 receives the address A, the data input D, the writing enable signal WE, and the reading enable signal RE as an input signal and outputs the data output Q. The control circuit 211 outputs an address predecode signal to each of the column selection circuit 214 and the row selection circuit 215 on the basis of the address A. When the writing enable signal WE is at the high level, the control circuit 211 outputs a driver setting signal for writing input data to each of the column driver 212 and the row driver 213.

When the reading enable signal RE is at the high level, the control circuit 211 outputs the driver setting signal for reading to each of the column driver 212 and the row driver 213, and outputs a reading circuit control signal to the reading circuit 216. Further, the control circuit 211 receives data output IQ from the reading circuit 216 and outputs the data output Q to the outside. Further, the control circuit 211 outputs an error detection circuit control signal to the first error detection circuit 217 and receives first error information from the first error detection circuit 217.

Next, the connection relationship between circuit components will be described. The column selection circuit 214 selects a desired column selection line (CSEL0 or CSEL1) based on the address predecode signal. Further, the column selection circuit 214 outputs a decode signal for selecting the wiring PH to the column driver 212. The row selection circuit 215 selects a desired row selection line (RSEL0 or RSEL1) based on the address predecode signal. Further, the row selection circuit 215 outputs a decode signal for selecting the wirings PV and PB to the row driver 213.

The column driver 212 supplies the switch cells with a writing voltage or a reading voltage through the wiring PH. The row driver 213 supplies the switch cells with a writing voltage or a reading voltage through the wiring PV. The row driver 213 supplies a writing voltage through the wiring PB.

The reading circuit 216 senses a resistance state of each switch cell through the wiring PB. The first error detection circuit 217 determines whether or not there is an error in each switch cell on the basis of output data IQ from the reading circuit 216, and outputs, to the control circuit 211, the determination result as the first error information.

Next, the connection relationship of the switch cell array 218 will be described. The vertical line VL0 is connected to the wiring PV through the NMOS transistor NV0. A gate of the NMOS transistor NV0 is connected to the column selection line CSEL0. The vertical line VL1 is connected to the wiring PV through the NMOS transistor NV1. A gate of the NMOS transistor NV1 is connected to the column selection line CSEL1. The column selection circuit 214 uses the column selection line (CSEL0 or CSEL1) to render a desired NMOS transistor (NV0 or NV1) conductive to connect the wiring PV and the vertical line (VL0 or VL1) to each other.

The horizontal line HL0 is connected to the wiring PH through the NMOS transistor NH0. A gate of the NMOS transistor NH0 is connected to the row selection line RSEL0. The horizontal line HL1 is connected to the wiring PH through the NMOS transistor NH1. A gate of the NMOS transistor NH1 is connected to the row selection line RSEL1. The row selection circuit 215 uses the row selection line (RSEL0 or RSEL1) to render a desired NMOS transistor (NH0 or NH1) conductive to connect the wiring PH and the horizontal line (HL0 or HL1) to each other.

A bit line BL0 is connected to the wiring PB through the NMOS transistor NB0. A gate of the NMOS transistor NB0 is connected to the column selection line CSEL0. A bit line BL1 is connected to the wiring PB through the NMOS transistor NB1. A gate of the NMOS transistor NB1 is connected to the column selection line CSEL1. The column selection circuit 214 uses the column selection line (CSEL0 or CSEL1) to render a desired NMOS transistor (NB0 or NB1) conductive to connect the wiring PB and the bit line (BL0 or BL1) to each other.

Next, the connection relationship among the switch cells will be described. The switch cell SC00 will now be described by way of example. The configuration of each of the switch cell SC01, the switch cell SC10, and the switch cell SC11 is similar to that of the switch cell SC00. The switch cell SC00 includes the first resistance change switch U00, the second resistance change switch L00, and the NMOS transistor N00.

One terminal of the first resistance change switch U00 is connected to the horizontal line HL0. Another terminal thereof is connected to one terminal of the second resistance change switch L00 and forms a shared node. Another terminal of the second resistance change switch L00 is connected to the vertical line VL0. A common node is connected to a source or drain of the NMOS transistor N00, and the drain or source of the NMOS transistor N00 is connected to the bit line BL0. The gate of the NMOS transistor is connected to the row selection line RSEL0. The row selection circuit 215 uses the row selection line RSEL0 to render the NMOS transistor N00 conductive to connect the common node and the bit line BL0 to each other. The first resistance change switch U00 and the second resistance change switch L00 which are connected in series function as a three-terminal resistance change switch.

Figure 7A:
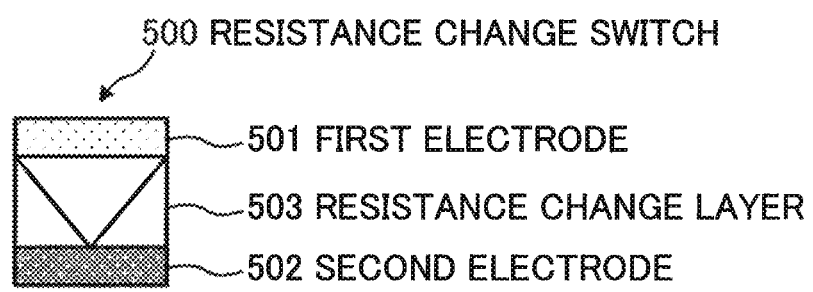
FIG. 7A is a diagram illustrating a configuration of a resistance change switch.

As the first and second resistance change switches U00 and L00, resistance-variable nonvolatile memory elements used for a Conductive Bridge Random Access Memory (CBRAM) can be used. The memory elements of the CBRAM can be bipolar-type resistance change elements of metal bridge type using an ion conductor for a resistance change layer as illustrated in FIG. 7A.

In a resistance change switch using an ion conductor, when a second electrode 502, which is an inactive electrode, is grounded and a positive voltage is applied to a first electrode 501, which is an active electrode, metal in the active electrode is dissolved in a resistance change layer 503, which is an ion conductive layer, as metal ions. The metal ions in the ion conductive layer are deposited as metal in the ion conductive layer, and the deposited metal forms a metal bridge for connecting the inactive electrode and the active electrode to each other. The both electrodes are connected by the metal bridge, thereby bringing the switch into a low resistance state. On the other hand, when the inactive electrode is grounded in a low resistance state and a negative voltage is applied to the active electrode, the metal bridge is dissolved in the resistance change layer 503 and a part of the metal bridge is broken. Thus, the connection between the both electrodes is disconnected, thereby bringing the switch into a high resistance state. To change the resistance state from a high resistance state to a low resistance state again, the inactive electrode may be grounded again and a positive voltage may be applied to the active electrode. In the resistance change switch, ON and OFF states of the switch can be achieved by using the low resistance state and the high resistance state described above.

Note that at a stage before the electrodes are connected by the metal bridge, a transient state, such as a state where a resistance between the both electrodes gradually decreases, or a state where a capacitance between the electrodes varies, occurs, and finally, the both electrodes are connected to thereby bring the resistance change switch into the low resistance state. Further, at a stage before the connection by the metal bridge is disconnected, a transient state, such as a state where the resistance between the both electrodes gradually increases, or a state where the capacitance between the electrodes varies, occurs, and finally, the connection between the both electrodes is disconnected to thereby bring the resistance change switch into the high resistance state. An intermediate state between the low resistance state and the high resistance state may be provided by using the above-described transient state.

As the first and second resistance change switches U00 and L00, resistance-variable nonvolatile memory elements used for a Phase Change Random Access Memory (PRAM), a Resistance Random Access Memory (ReRAM), and the like can be used.

The first and second resistance change switches U00 and L00 include two resistance states, i.e., the low resistance state and the high resistance state. The low resistance state is defined as an ON state and the high resistance state is defined as an OFF state. When the resistance change switch is in the ON state, a signal given by a voltage level passes through the resistance change switch. On the other hand, when the resistance change switch is in the OFF state, the signal is blocked by the resistance change switch and thus does not pass through the resistance change switch.

The resistance states of the first and second resistance change switches U00 and L00 are associated with data 1 and 0 (referred to as data 1 and data 0, respectively) of configuration information, and the low resistance state is defined as data 1 and the high resistance state is defined as data 0.

Figure 8A:
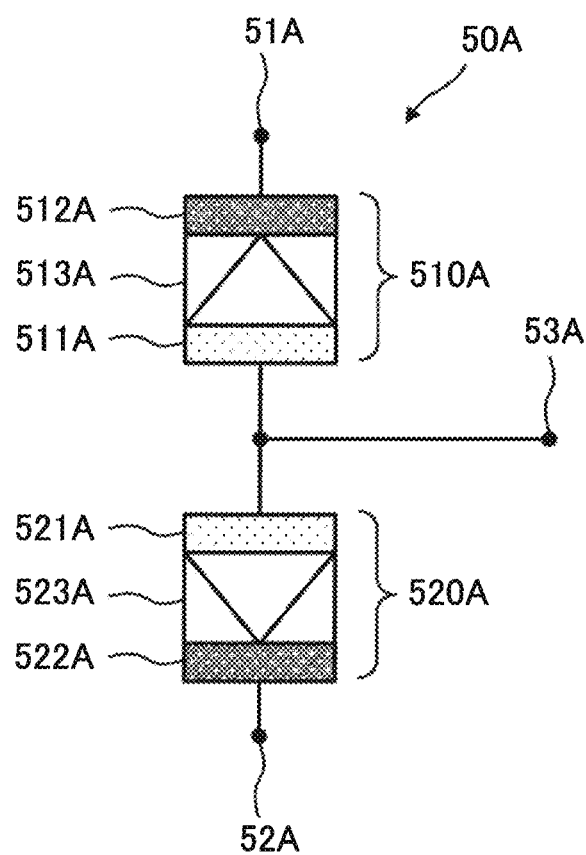
FIG. 8A is a diagram illustrating a configuration of a three-terminal resistance change switch.

The switch cell SC00 illustrated in FIG. 3 illustrates a case where a configuration of a three-terminal resistance change switch 50A illustrated in FIG. 8A is used. A first electrode (corresponding to 511A) of the first resistance change switch U00 (corresponding to 510A) and a first electrode (corresponding to 521A) of the second resistance change switch L00 (corresponding to 520A) are connected to each other to form a common node (corresponding to 53A). In other words, the first resistance change switch U00 and the second resistance change switch L00 have polarities symmetrical with respect to the common node.

A second electrode (corresponding to 512A) of the first resistance change switch U00 is connected to the horizontal line HL0. A second electrode (corresponding to 522A) of the second resistance change switch L00 is connected to the vertical line VL0.

The switch cell SC00 turns ON when the first resistance change switch U00 and the second resistance change switch L00 are in the ON state, and turns OFF when the first resistance change switch U00 and the second resistance change switch L00 are in the OFF state.

Note that a configuration of a three-terminal-type resistance change switch 50B illustrated in FIG. 8B can also be used. In this case, the voltage corresponding to the polarity of the resistance change switch may be set in the process of writing each switch cell to be described below.

Next, a method for writing each switch cell will be described. A case where the switch cell SC00 is set from OFF to ON will now be described by way of example. First, the first resistance change switch U00 is set from the OFF state to the ON state. The column driver 212 applies a low voltage (VL) to the wiring PH. The row driver 213 applies a high voltage (VH) equal to or higher than a set voltage to the wiring PB. Further, the row selection circuit 215 uses the row selection line RSEL0 to render the NMOS transistor NH0 conductive and applies the low voltage VL to the horizontal line HL0. The column selection circuit 214 uses the column selection line CSEL0 to render the NMOS transistor NB0 conductive and applies the high voltage VH to the bit line BL0. The row selection circuit 215 uses the row selection line RSEL0 to render the NMOS transistor N00 conductive and applies the high voltage VH to the first electrode (common node) of the first resistance change switch U00. As a result, the first resistance change switch U00 is brought into the ON state.

Note that the row driver 213 may set the wiring PV to an intermediate voltage (VH+VL)/2 or a high impedance. In this case, the column selection circuit 214 uses the column selection line CSEL0 to render the NMOS transistor NV0 conductive to connect the wiring PV and the vertical line VL0 to each other. Since a voltage equal to or lower than the set voltage is applied to the second resistance switch L00, L00 remains in the OFF state.

Next, the second resistance change switch L00 is set from the OFF state to the ON state. The row driver 213 applies a low voltage (VL) to the wiring PV and applies a high voltage (VH) equal to or higher than the set voltage to the wiring PB. Further, the column selection circuit 214 uses the column selection line CSEL0 to render the NMOS transistors NV0 and NB0 conductive and applies the low voltage VL to the vertical line VL0 and applies the high voltage VH to the bit line BL0. The row selection circuit 215 uses the row selection line RSEL0 to render the NMOS transistor N00 conductive and applies the high voltage VH to the first electrode (common node) of the second resistance change switch L00. As a result, the second resistance change switch L00 is brought into the ON state.

Note that the column driver 212 may set the wiring PH to an intermediate voltage (VH+VL)/2 or a high impedance. In this case, the row selection circuit 215 uses the row selection line RSEL0 to render the NMOS transistor NH0 conductive to connect the wiring PH and the horizontal line HL0 to each other. A voltage equal to or lower than the set voltage is applied to the first resistance switch U00. U00 remains in the ON state.

The operation described above enables setting of the first resistance change switch U00 and the second resistance change switch L00 and brings the switch cell SC00 into the ON state.

Next, a case where the switch cell SC00 is reset from ON to OFF will be described. First, the first resistance change switch U00 is reset from the ON state to the OFF state. The column driver 212 applies a high voltage (VH) equal to or higher than a reset voltage to the wiring PH. The row driver 213 applies a low voltage (VL) to the wiring PB. Further, the row selection circuit 215 uses the row selection line RSEL0 to render the NMOS transistor NH0 conductive and applies the high voltage VH to the horizontal line HL0. The column selection circuit 214 uses the column selection line CSEL0 to render the NMOS transistor NB0 conductive and applies the low voltage VL to the bit line BL0. The row selection circuit 215 uses the row selection line RSEL0 to render the NMOS transistor N00 conductive and applies the low voltage VL to the first electrode (common node) of the first resistance change switch U00. As a result, the first resistance change switch U00 is brought into the OFF state.

Note that the row driver 213 may set the wiring PV to an intermediate voltage (VH+VL)/2 or a high impedance. In this case, the column selection circuit 214 uses the column selection line CSEL0 to render the NMOS transistor NV0 conductive to connect the wiring PV and the vertical line VL0 to each other. Since a voltage equal to or lower than the reset voltage is applied to the second resistance change switch L00, L00 remains in the ON state.

Next, the second resistance change switch L00 is reset from the ON state to the OFF state. The row driver 213 applies a high voltage (VH) equal to or higher than the reset voltage to the wiring PV and applies a low voltage (VL) to the wiring PB. Further, the column selection circuit 214 uses the column selection line CSEL0 to render the NMOS transistors NV0 and NB0 conductive and applies the high voltage VH to the vertical line VL0 and applies the high voltage VL to the bit line BL0. The row selection circuit 215 uses the row selection line RSEL0 to render the NMOS transistor N00 conductive and applies the low voltage VL to the first electrode (common node) of the second resistance change switch L00. As a result, the second resistance change switch L00 is brought into the OFF state.

Note that the column driver 212 may set the wiring PH to an intermediate voltage (VH+VL)/2 or a high impedance. In this case, the row selection circuit 215 uses the row selection line RSEL0 to render the NMOS transistor NH0 conductive to connect the wiring PH and the horizontal line HL0 to each other. A voltage equal to or lower than the reset voltage is applied to the first resistance switch U00. U00 remains in the OFF state.

The operation described above enables resetting of the first resistance change switch U00 and the second resistance change switch L00 and brings the switch cell SC00 into the OFF state.

Next, a method for reading each switch cell will be described. A case where a state of the switch cell SC00 is read will now be described by way of example. First, a resistance state of the first resistance change switch U00 is read. Accordingly, the column driver 212 applies a low voltage (VL) to the wiring PH. The reading circuit 216 applies a sense voltage VS to the wiring PB. The row driver 213 sets the wiring PV to a high impedance. Further, the row selection circuit 215 uses the row selection line RSEL0 to render the NMOS transistor NH0 conductive and applies the low voltage VL to the horizontal line HL0. The column selection circuit 214 uses the column selection line CSEL0 to render the NMOS transistor NB0 conductive and applies the sense voltage VS to the bit line BL0. The row selection circuit 215 uses the row selection line RSEL0 to render the NMOS transistor N00 conductive and applies the sense voltage VS to the first electrode (common node) of the first resistance change switch U00. As a result, a sense current flows according to the resistance state of the first resistance change switch U00.

The reading circuit 216 converts, for example, a sense current into a voltage, and then compares the voltage with a reference voltage, thereby determining the resistance state of the first resistance change switch U00. When the resistance value is smaller than a predetermined value, the data 1 is output as the output data IQ, and when the resistance value is larger than the predetermined value, the data 0 is output as the output data IQ.

Next, a resistance state of the second resistance change switch L00 is read. The row driver 213 applies the low voltage VL to the wiring PV. The reading circuit 216 applies the sense voltage VS to the wiring PB. The column driver 212 sets the wiring PH to a high impedance. Further, the column selection circuit 214 uses the column selection line CSEL0 to render the NMOS transistors NV0 and NB0 conductive and applies the low voltage VL to the vertical line VL0 and applies the sense voltage VS to the bit line BL0. The row selection circuit 215 uses the row selection line RSEL0 to render the NMOS transistor N00 conductive and applies the sense voltage VS to the first electrode (common node) of the second resistance change switch L00. As a result, a sense current flows according to the resistance state of the second resistance change switch L00.

The reading circuit 216 converts, for example, the sense current into a voltage, and then compares the voltage with the reference voltage, thereby determining the resistance state of the second resistance change switch L00. When the resistance value is smaller than a predetermined value, the data 1 is output as the output data IQ, and when the resistance value is larger than the predetermined value, the data 0 is output as the output data IQ.

Next, a method for detecting an error in each switch cell will be described. The first error detection circuit 217 uses the fact that, in each switch cell, only a combination of 1 and 1 or 0 and 0 is used among the combinations of the data 0 and the data 1 of the first resistance change switch and the second resistance change switch, to thereby detect an error as described below. A case where an error in the switch cell SC00 is detected will now be described by way of example.

The reading circuit 216 determines the resistance state of the first resistance change switch U00 and outputs the output data IQ(U00). The reading circuit 216 determines the resistance state of the second resistance change switch L00 and outputs the output data IQ(L00).

The first error detection circuit 217 latches the output data IQ(U00) and IQ(L00) by the error detection circuit control signal. Further, the first error detection circuit 217 compares the output data IQ(U00) with the output data IQ(L00). When the two pieces of data are identical, the first error detection circuit 217 determines that there is no error in the switch cell SC00, and when the two pieces of data are different, the first error detection circuit 217 determines that there is an error in the switch cell SC00.

Specifically, the error detection circuit 217 outputs first error information based on a result of the comparison. The error detection circuit 217 may output, as the first error information, a signal corresponding to the presence or absence of an error. Further, the error detection circuit 217 may output a signal only when there is an error. Furthermore, the error detection circuit 217 may output a signal only when there is no error.

The control circuit 211 may include an error address storage unit and store an error address in the error address storage unit on the basis of the first error information. When there is an error, the control circuit 211 may acquire accurate data from an external nonvolatile memory and write the data into the switch cell SC00 by using, as writing circuits, the row selection circuit 215, the row driver 213, the column selection circuit 214, and the column driver 212. Alternatively, an error in one of U00 and L00 is specified in combination with another error detection method and data on the resistance change element including the error may be inverted.

Figure 4:
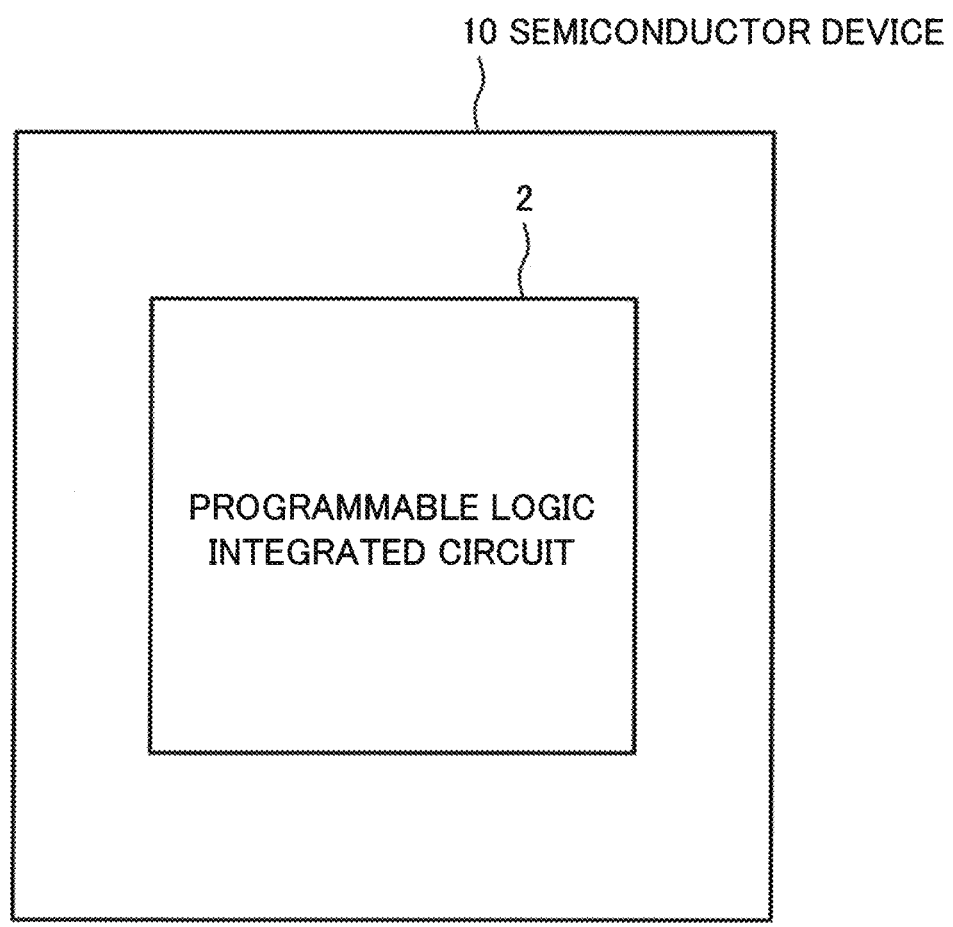
FIG. 4 is a block diagram illustrating a configuration of a semiconductor device according to the second example embodiment of the present invention.

FIG. 4 is a block diagram illustrating a configuration of a semiconductor device according to this example embodiment. A semiconductor device 10 is a semiconductor device including a programmable logic integrated circuit 2 according to this example embodiment. The semiconductor device 10 may include a package for protecting the circuit.

As described above, the programmable logic integrated circuit 2 according to this example embodiment uses a three-terminal resistance change switch with high error resistance as a switch constituting the programmable logic core, which enables a reduction in occurrence of an error. Further, an error is detected on the basis of a combination of data 0 and data 1 of a first resistance change switch and a second resistance change switch that constitute a switch cell. This eliminates the need for adding a parity bit for error detection and thus prevents an increase in chip area.

Therefore, according to this example embodiment, it is possible to provide a logic integrated circuit that increases the reliability of configuration information held in a switch while maintaining a high tamper resistance and a small chip area.

Third Example Embodiment

Figure 5:
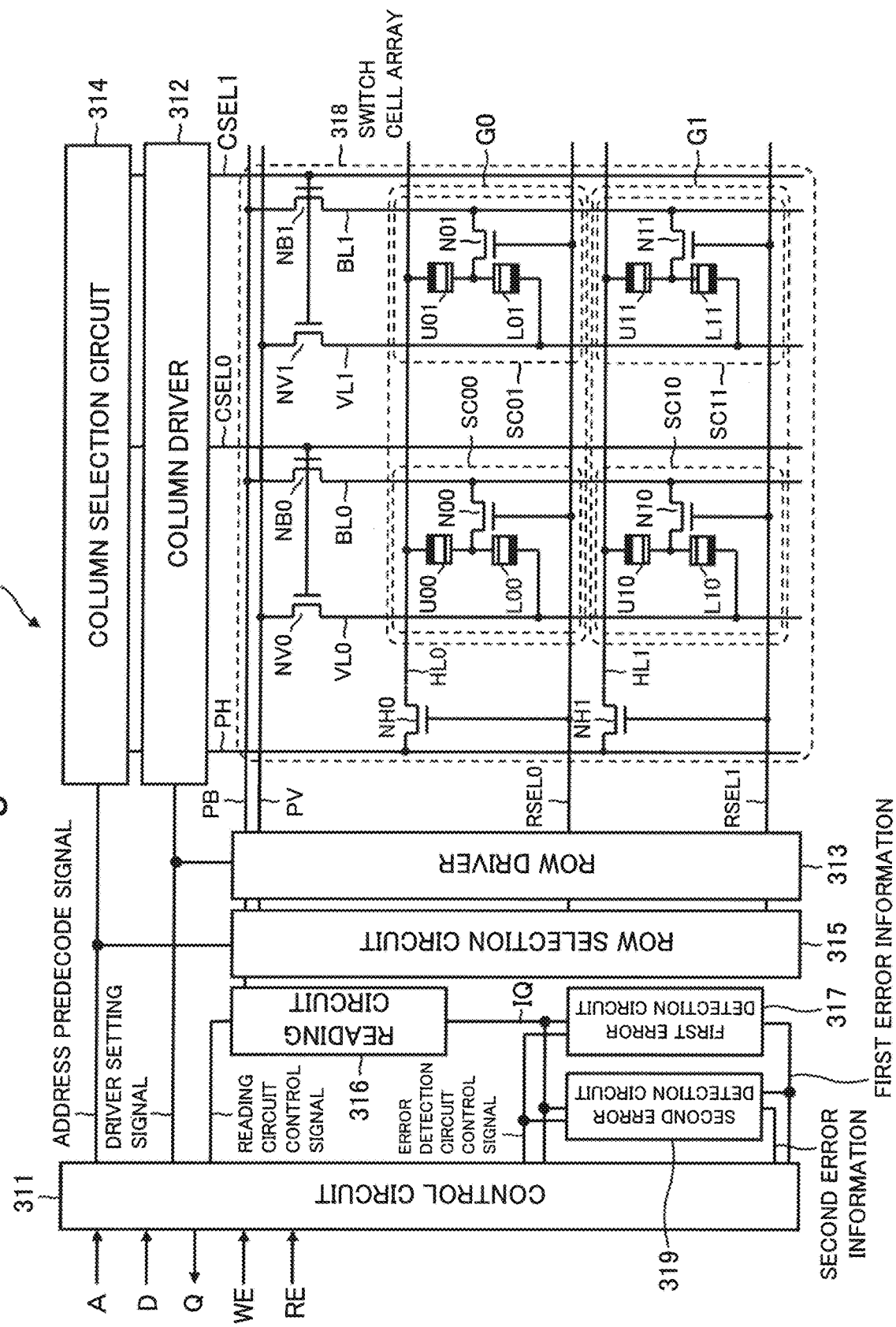
FIG. 5 is a schematic diagram illustrating a circuit configuration of a programmable logic core of a programmable logic integrated circuit according to a third example embodiment of the present invention.

A configuration of a programmable logic integrated circuit according to a third example embodiment of the present invention is similar to the configuration of the programmable logic integrated circuit according to the second example embodiment of the present invention illustrated in FIG. 2, except for the configuration of the programmable logic core. FIG. 5 is a schematic diagram illustrating a circuit configuration of the programmable logic core of the programmable logic integrated circuit according to this example embodiment.

A programmable logic core 31 includes a control circuit 311, a column driver 312, a row driver 313, a column selection circuit 314, and a row selection circuit 315. The programmable logic core 31 further includes a reading circuit 316, a first error detection circuit 317, a switch cell array 318, and a second error detection circuit 319.

The programmable logic core 31 differs from the programmable logic core 21 according to the second example embodiment in that the programmable logic core 31 includes the second error detection circuit 319. Other components of the programmable logic core 31 are similar to those of the programmable logic core 21, and thus a repeated explanation thereof is omitted. The second error detection circuit 319 receives the error detection circuit control signal from the control circuit 311, the output data IQ from the reading circuit 316, and the first error information from the first error detection circuit 317. Further, the second error detection circuit 319 specifies a switch cell in which an error has occurred, and outputs a result as second error information to the control circuit 311.

Like the switch cell array 218 according to the second example embodiment, the switch cell array 318 includes a group of N (N is an integer not less than 2) vertical lines extending in a column direction and a group of M (M is an integer not less than 2) horizontal lines extending in a row direction. Further, the switch cell array 318 includes N×M switch cells at maximum that are each provided at a portion where a vertical line and a horizontal line intersect with each other and configured to switch connection and non-connection between the vertical line and the horizontal line. FIG. 5 illustrates an example of the configuration of the switch cell array, which includes two horizontal lines HL0 and HL1 extending in the row direction, two vertical lines VL0 and VL1 extending in the column direction, and switch cells SC00, SC01, SC10, and SC11 arranged in the respective portions where the vertical line and the horizontal line intersect with each other. Other components of the switch cell array 318 are similar to those of the switch cell array 218 according to the second example embodiment.

In this example embodiment, the switch cell array 318 can be used as a crossbar switch for configuring a logic circuit. When the switch cell array 318 is used as a crossbar switch, the column selection circuit 314 uses the column selection lines CSEL0 and CSEL1 to bring the NMOS transistors NV0, NV1, NB0, and NB1 into a non-conductive state. The row selection circuit 315 uses the row selection lines RSEL0 and RSEL1 to bring the NMOS transistors NH0, NH1, N00, N01, N10, and N11 into the non-conductive state.

A case where an input signal input to the crossbar switch is supplied to the vertical line VL and an output signal output from the crossbar switch is output from the horizontal line HL will be described. It is assumed herein that the switch cells SC00 and SC01 on the horizontal line HL0 belong to a 0th group G0, and that the switch cells SC10 and SC11 on the horizontal line HL1 belong to a first group G1. In the crossbar switch, only one of the switch cells in each group is generally set to ON. This is because, in a case where two or more switch cells are set to ON, if different signals are respectively supplied to vertical lines connected to the ON switch cells, a collision of signals occurs.

Examples of the case where two or more switch cells are set to ON include a case where signals are multiplexed. When an error occurs in one of the ON switch cells and the switch cell turns off, the crossbar switch enables signals to function accurately by multiplexing signals. Accordingly, the number of switches to be turned ON in each group is determined based on reliability of holding data in each switch cell and an allowed amount of increase in chip area due to multiplexing for securing the reliability.

Thus, assuming that the number of switch cells to be turned ON in each group is represented by L (L is a positive integer), when the number of switch cells to be turned ON does not match L, it can be determined that there is an error. Each switch cell includes two resistance change switches. Accordingly, in terms of the resistance change switches, when the number of resistance change switches to be turned ON does not match 2L, it can be determined that there is an error. A method for detecting an error in the switch array 318 when L is 1, i.e., when it is assumed that one switch cell is set to ON among the switch cells in each group will be described.

A case where no error has occurred after the switch cell SC00 in the group G0 is programmed to be turned ON and the switch cell SC01 in the group G0 is programmed to be turned OFF will now be described. The reading circuit 316 determines the resistance states of the first resistance change switches U00 and U01 and the second resistance change switches L00 and L01 in the group G0, and outputs output data IQ(U00), IQ(L00), IQ(U01), and IQ(L01). The second error detection circuit 319 latches the output data IQ(U00), IQ(L00), IQ(U01), and IQ(L01) by the error detection circuit control signal.

The second error detection circuit 319 counts the number of pieces of data 1 in the group G0 and compares the number of pieces of data 1 with an expected value of the count number of the data 1. The expected value used herein is set to 2, because the number of switch cells to be turned ON in the group is one and two resistance change switches that constitute each switch cell indicate the data 1. Since the two pieces of IQ(U00) and IQ(L00) correspond to the data 1 in this case, the count number of the data 1 is equal to the expected value 2. In this case, the second error detection circuit 319 determines that there is no error. The second error detection circuit 319 outputs, as the second error information, the presence or absence of an error in the group G0, the error address, the count number of the data 1, and the like.

Next, a case where an error in which the first resistance change switch U00 is brought into the OFF state has occurred after the switch cell SC00 in the group G0 is programmed to be turned ON and the switch cell SC01 in the group G0 is programmed to be turned OFF will be described. The reading circuit 316 determines the resistance states of the first resistance change switches U00 and U01 and the second resistance change switches L00 and L01 in the group G0, and outputs the output data IQ(U00), IQ(L00), IQ(U01), and IQ(L01). The second error detection circuit 319 latches the output data IQ(U00), IQ(L00), IQ(U01), and IQ(L01) by the error detection circuit control signal.

The second error detection circuit 319 counts the number of pieces of data 1 in the group G0 and compares the number of pieces of data 1 with an expected value of the count number of the data 1. Since IQ(L00) corresponds to the data 1, the count number of the data 1 is 1, which is smaller than the expected value 2. Accordingly, the second error detection circuit 319 determines that an error in which the data 1 is changed to the data 0 has occurred.

On the other hand, the first error detection circuit 317 outputs, to the second error detection circuit 319, information indicating that an error has occurred in the switch cell SC00 due to a difference between the values of IQ(U00) and IQ(L00), as the first error information. Since the second error detection circuit 319 determines that an error in which the data 1 is changed to the data 0 has occurred, the second error detection circuit 319 receives the first error information and checks the resistance change switch indicating the data 0 out of U00 and L00 constituting the switch cell SC00. In this example, IQ(U00) corresponds to the data 0, and thus it is determined that an error has occurred in U00. The second error detection circuit 319 outputs, as the second error information, the presence or absence of an error in the group G0, the error address, the count number of the data 1, and the like.

Next, a case where an error in which the first resistance change switch U01 is brought into the ON state has occurred after the switch cell SC00 in the group G0 is programmed to be turned ON and the switch cell SC01 in the group G0 is programmed to be turned OFF will be described. The reading circuit 316 determines that the resistance states of the first resistance change switches U00 and U01 and the second resistance change switches L00 and L01 in the group G0, and outputs the output data IQ(U00), IQ(L00), IQ(U01), and IQ(L01). The second error detection circuit 319 latches the output data IQ(U00), IQ(L00), IQ(U01), and IQ(L01).

The second error detection circuit 319 counts the number of pieces of data 1 in the group G0 and compares the number of pieces of data 1 with the expected value 2 of the count number of the data 1. Since IQ(U00), IQ(L00), and IQ(U01) correspond to the data 1, the count number of the data 1 is 3, which is larger than the expected value 2. Accordingly, the second error detection circuit 319 determines that an error in which the data 0 is changed to the data 1 has occurred.

On the other hand, the first error detection circuit 317 outputs, to the second error detection circuit 319, information indicating that an error has occurred in the switch cell SC01 due to a difference between the values of IQ(U01) and IQ(L01), as the first error information. Since the second error detection circuit 319 determines that an error in which the data 0 is changed to the data 1 has occurred, the second error detection circuit 319 receives the first error information and checks the resistance change switch indicating the data 1 out of U01 and L01 constituting the switch cell SC01. In this example, IQ(U01) corresponds to the data 1, and thus it is determined that an error has occurred in U01. The second error detection circuit 319 outputs, as the second error information, the presence or absence of an error in the group G0, the error address, the count number of the data 1, and the like.

The control circuit 311 may include an error address storage unit and store the error address in the error address storage unit on the basis of the second error information. When there is an error, the control circuit 311 may invert error-bit data by using, as writing circuits, the row selection circuit 315, the row driver 313, the column selection circuit 314, and the column driver 312.

As described above, the first error detection circuit 317 compares data on the first resistance change switch in each switch cell with data on the second resistance change switch in each switch cell, and determines that there is an error when the pieces of data are different. When the number of pieces of data 1 out of the data 1 and the data 0 in each group is smaller than a predetermined number 2L, the second error detection circuit 319 determines that the data 0 out of the data 1 and the data 0 in the switch cell in which an error is determined by the first error detection circuit 317 is an error. When the number of pieces of data 1 is larger than the predetermined number 2L, the data 1 out of the data 1 and the data 0 in the switch cell in which an error is determined by the first error detection circuit 317 is determined to be an error.

As described above, the programmable logic integrated circuit according to this example embodiment uses a three-terminal resistance change switch with high error resistance as a switch constituting the programmable logic core, which enables a reduction in occurrence of an error. In addition, it is possible to identify and correct the switch in which an error has occurred, without adding any parity bit. Further, since the identification of an error location and the correction of the error can be carried out in the programmable logic integrated circuit, the programmable logic integrated circuit has a high tamper resistance.

Therefore, according to this example embodiment, it is possible to provide a logic integrated circuit that increases the reliability of configuration information held in a switch while maintaining a high tamper resistance and a small chip area.

Fourth Example Embodiment

A configuration of a programmable logic integrated circuit according to a fourth example embodiment of the present invention is similar to the configuration of the programmable logic integrated circuit according to the second example embodiment of the present invention illustrated in FIG. 2, except for the configuration of the programmable logic core. FIG. 6 is a schematic diagram illustrating a circuit configuration of the programmable logic core of the programmable logic integrated circuit according to this example embodiment.

A programmable logic core 41 includes a control circuit 411, a column driver 412, a row driver 413, a column selection circuit 414, and a row selection circuit 415. The programmable logic core 41 further includes a reading circuit 416, a first error detection circuit 417, a switch cell array 418, and a second error detection circuit 419.

The programmable logic core 41 according to this example embodiment differs from the programmable logic core 31 according to the third example embodiment, in that the wiring PV is divided into a wiring PVH and a wiring PVL. Other components of the programmable logic core 41 are similar to those of the programmable logic core 31 according to the third example embodiment, and thus a repeated explanation thereof is omitted.

The switch cell array 418 includes a group of N (N is an integer not less than 2) vertical lines extending in a column direction and a group of M (M is an integer not less than 2) horizontal lines extending in a row direction. Further, the switch cell array 418 includes N×M switch cells at maximum that are each provided at a portion where a vertical line and a horizontal line intersect with each other and configured to switch connection and non-connection between the vertical line and the horizontal line. FIG. 6 illustrates an example of the configuration of the switch cell, which includes two horizontal lines HL0 and HL1 extending in the row direction, two vertical lines VL0 and VL1 extending in the column direction, and switch cells SC00, SC01, SC10, and SC11 arranged in the respective portions where the vertical line and the horizontal line intersect with each other.

The connection relationship of the switch cell array 418 will be described. The vertical line VL0 is connected to the wiring PVH through the NMOS transistor NV0. A gate of the NMOS transistor NV0 is connected to the column selection line CSEL0. The vertical line VL1 is connected to the wiring PVL through the NMOS transistor NV1. A gate of the NMOS transistor NV1 is connected to the column selection line CSEL1.

A method for writing each switch cell and a method for reading each switch cell may be carried out in the same manner as in the switch cell array 318 according to the third example embodiment by operating a group of PVH and PVL in the same manner as PV.

In this example embodiment, the switch cell array 418 can be used as a setting memory for performing a setting, such as a Lookup Table (LUT) of the programmable logic integrated circuit. When the switch cell array 418 is used as a setting memory, the column selection circuit 414 brings the NMOS transistors NV0, NV1, NB0, and NB1 into the conductive state by using the column selection lines CSEL0 and CSEL1. The row selection circuit 415 brings the NMOS transistors NH0, NH1, N00, N01, N10, and N11 into the non-conductive state by using the row selection lines RSEL0 and RSEL1. The row driver 413 applies a high voltage VH corresponding to a logical value 1 to the wiring PVH, and applies a low voltage VL corresponding to a logical value 0 to the wiring PVL. The row driver 413 applies, for example, the low voltage VL to the wiring PB.

Thus, the high voltage VH is applied to the vertical wiring VL0 through the NMOS transistor NV0. The low voltage VL is applied to the vertical wiring VL1 through the NMOS transistor NV1. The high voltage VH, the low voltage VL, or a high impedance is set to each of the horizontal lines HL0 and HL1 as a value of the setting memory.

It is assumed herein that the switch cells SC00 and SC01 on the horizontal line HL0 belong to the 0th group G0, and that the switch cells SC10 and SC11 on the horizontal line HL1 belong to the first group G1. Only one of the switch cells in each group is generally set to ON. This is because, in a case where two or more switch cells are set to ON, if different signals are supplied to vertical lines connected to the ON switch cells, a collision of signals occurs.

Examples of the case where two or more switch cells are set to ON include a case where signals are multiplexed. When an error occurs in one of the ON switch cells and the switch cell turns off, the crossbar switch enables signals to function accurately by multiplexing signals. Accordingly, the number of switches to be turned ON in each group is determined based on reliability of holding data in each switch cell and an allowed amount of increase in chip area due to multiplexing for securing the reliability.

Thus, assuming that the number of switch cells to be turned ON in each group is represented by L (L is a positive integer), when the number of switch cells to be turned ON does not match L, it can be determined that there is an error. Each switch cell includes two resistance change switches. Accordingly, in terms of the resistance change switches, when the number of resistance change switches to be turned ON does not match 2L, it can be determined that there is an error. Therefore, like the programmable logic core 31 according to the third example embodiment, the programmable logic core 41 is capable of detecting an error in the resistance change switch by using the first error detection circuit 417 and the second error detection circuit 419.

Specifically, the first error detection circuit 417 compares data on the first resistance change switch in each switch cell with data on the second resistance change switch in each switch cell, and determines that there is an error when the pieces of data are different. Further, when the number of pieces of data 1 out of the data 1 and the data 0 in each group is smaller than a predetermined number 2L, the second error detection circuit 419 determines that the data 0 out of the data 1 and the data 0 in the switch cell in which an error is determined by the first error detection circuit 417 is an error. When the number of pieces of data 1 is larger than the predetermined number 2L, the data 1 out of the data 1 and the data 0 in the switch cell in which an error is determined by the first error detection circuit 417 is determined to be an error.

As described above, the programmable logic integrated circuit according to this example embodiment uses a three-terminal resistance change switch with high error resistance as a switch constituting the programmable logic core, which enables a reduction in occurrence of an error. In addition, it is possible to identify and correct the switch in which an error has occurred, without adding any parity bit. Further, since the identification of an error location and the correction of the error can be carried out in the programmable logic integrated circuit, the programmable logic integrated circuit has a high tamper resistance.

Therefore, according to this example embodiment, it is possible to provide a logic integrated circuit that increases the reliability of configuration information held in a switch while maintaining a high tamper resistance and a small chip area.

The present invention is not limited to the example embodiments described above. The present invention can be modified in various manners within the scope of the invention described in claims, and such modifications are included in the scope of the present invention.

The whole or part of the example embodiments described above can be described as, but not limited to, the following supplementary notes.

(Supplementary Note 1)

A logic integrated circuit comprising:

a three-terminal resistance change switch including a first resistance change switch and a second resistance change switch connected in series;

a reading circuit which reads first data based on a resistance state of the first resistance change switch and second data based on a resistance state of the second resistance change switch; and a first error detection circuit which compares the first data with the second data and issue an output based on a result of the comparison.

(Supplementary note 2)

The logic integrated circuit according to Supplementary note 1, in which, when the first data and the second data are different, the first error detection circuit determines that there is an error.

(Supplementary note 3)

The logic integrated circuit according to Supplementary note 1 or 2, in which each of the first data and the second data includes 0 or 1.

(Supplementary note 4)

The logic integrated circuit according to Supplementary note 3, further comprising:

a switch cell array including a plurality of the three-terminal resistance change switches; and a selection circuit which selects any one of the three-terminal resistance change switches in the switch cell array.

(Supplementary note 5)

The logic integrated circuit according to Supplementary note 4, in which the switch cell array includes a group of N (N is an integer not less than 2) first wirings extending in a column direction, a group of M (M is an integer not less than 2) second wirings extending in a row direction, and the three-terminal resistance change switches each provided at an intersection between the first wiring and the second wiring and configured to switch connection and non-connection between the first wiring and the second wiring.

(Supplementary Note 6)

The logic integrated circuit according to Supplementary note 5, further comprising a second error detector which determines that, in a case where the number of 1 in the first data and the second data of the three-terminal resistance change switches on the second wiring is smaller than a predetermined number L (L is a positive integral multiple of 2), 0 in the first data and the second data of the three-terminal resistance change switch in which an error is determined by the first error detection circuit is an error, and determine that, in a case where the number of 1 is larger than the predetermined number L, 1 in the first data and the second data of the three-terminal resistance change switch in which an error is determined by the first error detection circuit is an error.

(Supplementary Note 7)

The logic integrated circuit according to Supplementary note 6, further comprising a writing circuit which inverts 0 determined to be an error by the second error detector into 1, or inverts 1 determined to be an error by the second error detector into 0.

(Supplementary Note 8)

The logic integrated circuit according to any one of Supplementary notes 1 to 7, in which the three-terminal resistance change switch includes a common terminal for connecting the first resistance change switch and the second resistance change switch in series, each of the first resistance change switch and the second resistance change switch has a bipolar type, and the first resistance change switch and the second resistance change switch have polarities symmetrical with respect to the common terminal.

(Supplementary Note 9)

The logic integrated circuit according to Supplementary note 8, further comprising a cell transistor, a bit line, and a row selection line, in which the common terminal is connected to the bit line through the cell transistor, and a gate of the cell transistor is connected to the row selection line.

(Supplementary Note 10)

The logic integrated circuit according to Supplementary note 9, further comprising a first transistor, a second transistor, a third transistor, a wiring PV, a wiring PH, a wiring PB, and a column selection line, in which the first wiring is connected to the wiring PV through the first transistor, a gate of the first transistor is connected to the column selection line, the second wiring is connected to the wiring PH through the second transistor, a gate of the second transistor is connected to the row selection line, the bit line is connected to the wiring PB through the third transistor, and a gate of the third transistor is connected to the column selection line.

(Supplementary Note 11)

The logic integrated circuit according to Supplementary note 10, further comprising a column selection circuit and a row selection circuit, in which the column selection circuit uses the column selection line to render the first transistor conductive to connect the wiring PV and the first wiring to each other, the row selection circuit uses the row selection line to render the second transistor conductive to connect the wiring PH and the second wiring to each other, and the column selection circuit uses the column selection line to render the third transistor conductive to connect the wiring PB and the bit line to each other.

(Supplementary Note 12)

The logic integrated circuit according to any one of Supplementary notes 8 to 11, in which the first resistance change switch includes a first terminal, a first resistance change element, and the common terminal, the second resistance change switch includes a second terminal, a second resistance change element, and the common terminal, the first resistance change element includes a series connection among a first electrode connected to the first terminal, a first resistance change layer, and a second electrode connected to the common terminal, the second resistance change element includes a series connection among a third electrode connected to the second terminal, a second resistance change layer, and a fourth electrode connected to the common terminal, and the first electrode and the third electrode each include an active electrode, the second electrode and the fourth electrode each include an inactive electrode, or the first electrode and the third electrode each include an inactive electrode, and the second electrode and the fourth electrode each include an active electrode.

(Supplementary Note 13)

The logic integrated circuit according to Supplementary note 12, in which each of the first resistance change element and the second resistance change element has a metal bridge type.

(Supplementary Note 14)

The logic integrated circuit according to Supplementary note 12 or 13, in which each of the first resistance change layer and the second resistance change layer includes an ion conductor.

(Supplementary Note 15)

A semiconductor device including the logic integrated circuit according to any one of Supplementary notes 1 to 14.

This application is based upon and claims the benefit of priority from Japanese patent application No. 2016-006790, filed on Jan. 18, 2016, the disclosure of which is incorporated herein in its entirety by reference.

REFERENCE SIGNS LIST 1, 2 Programmable logic integrated circuit
11 First resistance change switch
12 Second resistance change switch
13 Three-terminal resistance change switch
14 Reading circuit
15 First error detection circuit
21, 31, 41 Programmable logic core
22 Configuration circuit
23 General-purpose port
24 Configuration port
211, 311, 411 Control circuit
212, 312, 412 Column driver
213, 313, 413 Row driver
214, 314, 414 Column selection circuit
215, 315, 415 Row selection circuit
216, 316, 416 Reading circuit
217, 317, 417 First error detection circuit
218, 318, 418 Switch cell array
319, 419 Second error detection circuit
50A, 50B Three-terminal resistance change switch
500, 510A, 510B, 520A, 520B Resistance change switch
501, 511A, 511B, 521A, 521B First electrode
502, 512A, 512B, 522A, 522B Second electrode
503, 513A, 513B, 523A, 523B Resistance change layer

The invention claimed is:

1. A logic integrated circuit comprising:
a three-terminal resistance change switch including a first resistance change switch and a second resistance change switch being connected in series;
a reading circuit which reads first data based on a resistance state of the first resistance change switch and second data based on a resistance state of the second resistance change switch, each of the first data and the second data includes 0 or 1; and
a first error detection circuit which compares the first data with the second data and issue an output based on a result of the comparison.

2. The logic integrated circuit according to claim 1, wherein, when the first data and the second data are different, the first error detection circuit determines that there is an error.

3. The logic integrated circuit according to claim 1, further comprising:
a switch cell array including a plurality of the three-terminal resistance change switches; and
a selection circuit which selects any one of the three-terminal resistance change switches in the switch cell array.

4. The logic integrated circuit according to claim 3, wherein the switch cell array includes
a group of N (N is an integer not less than 2) first wirings extending in a column direction,
a group of M (M is an integer not less than 2) second wirings extending in a row direction, and
the three-terminal resistance change switches each provided at an intersection between the first wiring and the second wiring and configured to switch connection and non-connection between the first wiring and the second wiring.

5. The logic integrated circuit according to claim 4, further comprising a second error detector that determines that,
when a number of 1 in the first data and the second data of the three-terminal resistance change switches on the second wiring is smaller than a predetermined number L (L is a positive integral multiple of 2), 0 in the first data and the second data of the three-terminal resistance change switch in which an error is determined by the first error detection circuit is an error, and determine that,
when a number of 1 is larger than the predetermined number L, 1 in the first data and the second data of the three-terminal resistance change switch in which an error is determined by the first error detection circuit is an error.

6. The logic integrated circuit according to claim 5, further comprising a writing circuit that inverts 0 determined to be an error by the second error detector into 1, or inverts 1 determined to be an error by the second error detector into 0.

7. A semiconductor device comprising the logic integrated circuit according to claim 1.

8. A logic integrated circuit comprising:
a three-terminal resistance change switch including a first resistance change switch and a second resistance change switch being connected in series;
a reading circuit which reads a first data based on a resistance state of the first resistance change switch and second data based on a resistance state of the second resistance change switch; and a first error detection circuit which compares the first data with the second data and issue and output based on a result of the comparison, wherein the three-terminal resistance change switch includes a common terminal for connecting the first resistance change switch and the second resistance change switch in series, each of the first resistance change switch and the second resistance change switch has a bipolar type, and the first resistance change switch and the second resistance change switch have polarities symmetrical with respect to the common terminal.

9. The logic integrated circuit according to claim 8, further comprising a cell transistor, a bit line, and a row selection line, wherein the common terminal is connected to the bit line through the cell transistor, and a gate of the cell transistor is connected to the row selection line.

10. The logic integrated circuit according to claim 9, further comprising a first transistor, a second transistor, a third transistor, a wiring PV, a wiring PH, a wiring PB, and a column selection line, wherein the first wiring is connected to the wiring PV through the first transistor, a gate of the first transistor is connected to the column selection line, the second wiring is connected to the wiring PH through the second transistor, a gate of the second transistor is connected to the row selection line, the bit line is connected to the wiring PB through the third transistor, and a gate of the third transistor is connected to the column selection line.

11. The logic integrated circuit according to claim 10, further comprising a column selection circuit, and a row selection circuit, wherein the column selection circuit uses the column selection line to render the first transistor conductive, and thereby connect the wiring PV and the first wiring to each other, the row selection circuit uses the row selection line to render the second transistor conductive, and thereby connect the wiring PH and the second wiring to each other, and the column selection circuit uses the column selection line to render the third transistor conductive, and thereby connect the wiring PB and the bit line to each other.

12. The logic integrated circuit according to claim 8, wherein the first resistance change switch includes a first terminal, a first resistance change element, and the common terminal, the second resistance change switch includes a second terminal, a second resistance change element, and the common terminal, the first resistance change element includes a series connection among a first electrode connected to the first terminal, a first resistance change layer, and a second electrode connected to the common terminal, the second resistance change element includes a series connection among a third electrode connected to the second terminal, a second resistance change layer, and a fourth electrode connected to the common terminal, and the first electrode and the third electrode each include an active electrode, and the second electrode and the fourth electrode each include an inactive electrode, or the first electrode and the third electrode each include an inactive electrode, and the second electrode and the fourth electrode each include an active electrode.

13. The logic integrated circuit according to claim 12, wherein each of the first resistance change element and the second resistance change element has a metal bridge type.

14. The logic integrated circuit according to claim 12, wherein each of the first resistance change layer and the second resistance change layer includes an ion conductor.

* * * * *